United States Patent [19]

Hongu

[11] Patent Number: 5,555,323

[45] Date of Patent: Sep. 10, 1996

[54] SYSTEM FOR BI-LEVEL SYMBOL CODING/DECODING WITH SAVED STORAGE AND METHOD FOR SAME

[75] Inventor: Takahiro Hongu, Tokyo, Japan

[73] Assignee: NEC Corporation, Japan

[21] Appl. No.: 356,892

[22] Filed: Dec. 15, 1994

[30] Foreign Application Priority Data

Dec. 16, 1993 [JP] Japan ................... 5-316171

[51] Int. Cl.$^6$ .................................................. G06K 9/00
[52] U.S. Cl. ........................................... 382/247; 382/239
[58] Field of Search .................. 358/261.1, 261.2; 382/239, 245, 247, 232, 235, 244

[56] References Cited

U.S. PATENT DOCUMENTS

| | | | |
|---|---|---|---|
| 3,916,095 | 10/1975 | Weber et al. | 178/6 |
| 3,925,780 | 12/1975 | Van Voorhis | 340/347 DD |
| 4,034,406 | 7/1977 | Tsuchiya et al. | 358/261.1 |
| 4,610,027 | 9/1986 | Anderson et al. | 382/245 |
| 4,719,503 | 1/1988 | Craver et al. | 358/12 |
| 4,905,297 | 2/1990 | Langdon, Jr. et al. | 382/247 |
| 4,933,675 | 6/1990 | Beard | 341/110 |
| 5,274,719 | 12/1993 | Taniguchi et al. | 382/247 |
| 5,297,220 | 3/1994 | Nomizu | 382/247 |
| 5,309,381 | 5/1994 | Fukui | 382/247 |

OTHER PUBLICATIONS

Dr. Donald Duttweiler, Final Text for *ISO/IEC* 11544, Information technology—Coded representation of picture and audio information—Progressive bi-level image compression, Mar. 17, 1993. pp.:–74, IPSJ/ITSCJ, Tokyo, Japan. (Project: JTC Jan. 29, 1903).

*Primary Examiner*—Leo Boudreau
*Assistant Examiner*—Bijan Tadayon
*Attorney, Agent, or Firm*—Ostrolenk, Faber, Gerb & Soffen, LLP

[57] ABSTRACT

An arithmetic datastream representative of an original sequence of input bi-level symbols is transmitted, before an information code carrying information on a total length of the input symbols, from a coding subsystem to a decoding subsystem. A register shifts out respective transmitted portions of the datastream to an arithmetic decoder, where they are decoded into a symbol sequence starting with the same sequence as the original sequence. The decoded symbol sequence is output through an output circuit which counts symbols in that sequence. The register holds a final portion of the datastream. The information code is decoded by an information decoder, which informs the output circuit of decoded information, before flushing the register to input the final portion of the datastream to the arithmetic decoder. The output symbol sequence becomes equal in symbol number to the original sequence, when the output circuit stops outputting.

2 Claims, 9 Drawing Sheets

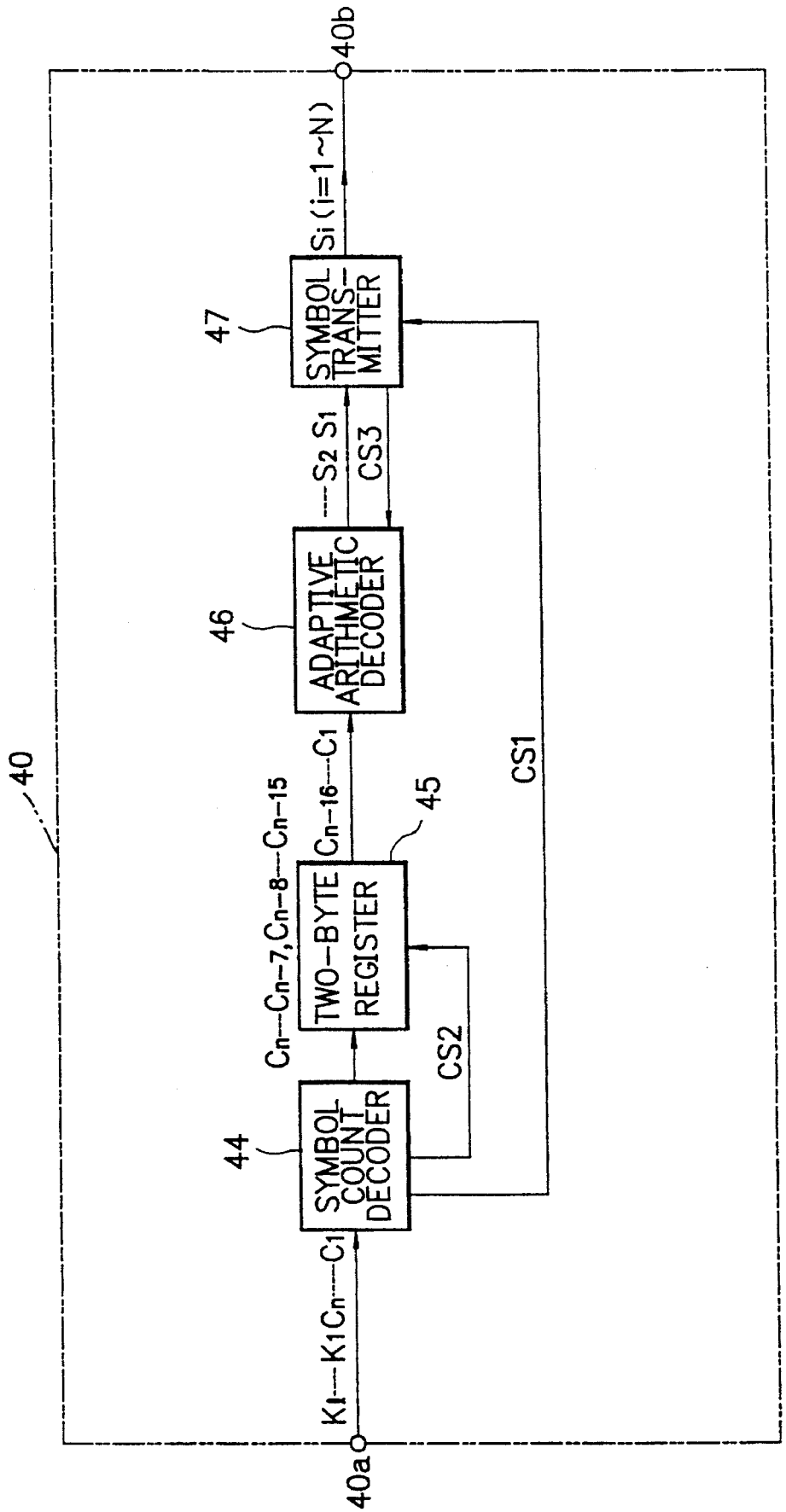
F I G. 7

5,555,323

SYSTEM FOR BI-LEVEL SYMBOL CODING/DECODING WITH SAVED STORAGE AND METHOD FOR SAME

BACKGROUND OF THE INVENTION

The present invention relates to a system for performing coding of and decoding to a sequence of bi-level symbols and to a method therefore. More specifically, the present invention relates to an arithmetic coding-decoding system for coding an original sequence of bi-level symbols into a compressed code representative of the original sequence of the symbols and decoding the code into a plurality of bi-level symbols arrayed in the original sequence, and to an arithmetic coding-decoding method therefore.

DESCRIPTION OF THE RELATED ART

There are known systems and methods for arithmetic coding of and an arithmetic decoding to a sequence of bi-level symbols, such as the ITU-T Recommendations T.82 or the Final Text for ISO/IEC 11544, Information technology—Coded representation of picture and audio information Progressive bi-level image compression.

Typical examples of such a conventional coding-decoding system and a conventional coding-decoding method are illustrated in FIGS. 1 and 2.

FIG. 1 shows a coding unit of the conventional coding-decoding system. The coding unit comprises an adaptive arithmetic coder 113 connected to an input terminal (not shown) of the coding unit, a trailing "0"-run eliminator 114 connected to the arithmetic coder 113, a data storing buffer 116 connected to the "0"-run eliminator 114, a code transmitter 115 interconnected between the buffer 116 and an output terminal (not shown) of the coding unit, and a symbol counter 112 interconnected between the input terminal and the code transmitter 115.

The input terminal receives a symbol sequence consisting of a plurality of bi-level symbols Si (i is an arbitrary integer between 1 to N, both inclusive) arrayed in an original sequence, such as a sequence of high and low levels shifted from a plurality of pixels arrayed in a stripe or column, that are inputted to the arithmetic coder 113. At arithmetic coder 113 the original sequence of the input bi-level symbols Si is coded into a data code consisting of a compressed datastream in the form of a sequence of bits Cj (j is an arbitrary integer between 1 to n, both inclusive) to be either of "0" and "1". The plurality of bi-level symbols Si are also inputted to the symbol counter 112, which counts a total number N of the input symbols Si and codes a total count N thereof into a count code in the form of a sequence of bits Kp (p is an arbitrary integer between 1 to l, both inclusive) to be either of "0" and "1".

The data code in the form of sequential bits Cj is outputted as bytes each consisting of eight bits, i.e in a byte mode, from the arithmetic coder 113 to the "0"-run eliminator 114. The "0"-run eliminator 114 eliminates a trailing run of "0" bits in a byte mode from the sequential bits Cj, So long as an employed protocol requires or permits, to output another data code consisting of further compressed datastream in the form of a sequence of bits ck (k is an arbitrary integer between 1 to m, both inclusive) to be either of "0" and "1". Due to the unit of "0"-run elimination being of one byte length or eight bits, the respective numbers n, m of the input bits Cj and the output bits Ck from the "0"-run eliminator 114 have a relationship therebetween, such that:

$$n \geq m$$

and $$m = n - 8xt \quad (1)$$

where, t is an arbitrary integer equal to or larger than 0.

The data code in the form of sequential bits Ck is outputted from the "0"-run eliminator 114 and inputted to the buffer 116, where the bits Ck are stored in the same sequence as they are inputted.

With the sequential bi-level symbols Si all inputted to the symbol counter 112 and counted and coded therein, the count code in the form of sequential bits Kp is outputted therefrom to the code transmitter 115. The transmitter 115 outputs the input count code, in the form of sequential bits Kp, before reading the data code, in the form of sequential bits Ck, from the buffer 116 to transmit this data code subsequently to the count code.

FIG. 2 shows a decoding unit of the conventional coding-decoding system. The decoding unit comprises a symbol number count code decoder 117 connected to an input terminal (not shown) of the decoding unit, a "0"-run compensator 118 connected to the count code decoder 117, an adaptive arithmetic data code decoder 119 connected to the "0"-run compensator 118, and a bi-level symbol output circuit 120 connected at the input side to the data code decoder 119 and the count code decoder 117 and at the output side to an output terminal (not shown) of the decoding unit.

To the count code-decoder 117 is inputted a code sequence consisting of the count code in the form of sequential bits Kp and the data code in the form of sequential bits Cm subsequent to the count code. The count code decoder 117 analyses the sequence of bits Kp in the count code to thereby decode the count code into a count signal representative of the total count N of the original bi-level symbols Si. The count signal is outputted from the count code decoder 117 to the symbol output circuit 120.

The data code in the input code sequence to the decoder 117 passes therethrough, so that it is outputted therefrom in the form of sequential bits Ck to the "0"-run compensator 118. At "0"-run compensator 118, it is decompressed into a data code consisting of a datastream in the form of sequential bits ck having a trailing "0"-run compensated with a lasting run length to complete an associated decoding. This data code is inputted to the arithmetic data code decoder 119, where it is decoded in a decompressing manner into a sequence of self-generated processable bi-level symbols $S_1$, $S_2$, . . . to be inputted to the symbol output circuit 120, which outputs these symbols in the same sequence as they are inputted, counting one by one, until it counts up a matching number to the total count N of the original symbols Si, when it completes the output. The total count N of the original symbols Si is previously identified by the count signal from the count code decoder 117 to the symbol output circuit 120, so that the total number N of decoded bi-level symbols Si are outputted in the original sequence in a complete form.

The conventional arithmetic coding-decoding system, as well as the coding-decoding method applied thereto, necessarily has a count code representative of a total count of sequentially input bi-level symbols placed ahead of a data code representative of an original sequence of the input symbols, for transmission of a combination of the count code and the data code. Hence there is a need for a buffer memory temporarily storing at the transmission side an increasing length of the data code until the count code is given in a complete form. Particularly in applications, such as in a facsimile unit requiring a prompt coding for transmission of each individual input part of an original sequence of symbols, the conventional system as well as the conventional method needs a memory for storing a remarkable length of coded data at the transmission side. The requirement adversely affects design flexibility, fabrication processing and a production costs, in addition to prohibiting prompt transmission. Accordingly, the present invention has been designed to overcome these problems.

SUMMARY OF THE INVENTION

It is an object of the present invention to provide a system, as well as a method, for arithmetic coding of and arithmetic decoding to an original sequence of bi-level symbols, permitting an arithmetic data code to be promptly transmitted without a temporary storage thereof at the coding end to wait a symbol count code as an information code for controlling the data code at an opponent decoding end, thus resulting in an effectively saved storage.

To achieve this object, a genus of the present invention provides an arithmetic coding-decoding system comprising a coding subsystem and a decoding subsystem. The coding subsystem codes a set of bi-level symbols, which are inputted to the system in an original sequence with a given total length, into a combination of a compressed arithmetic data code and an information code subsequent thereto. The data code includes sequentially transmittable portions that are cooperative with each other to represent the original sequence of the input symbols. The information code carries information on the total length of the original sequence. The coding subsystem transmits any portion of the data code and the information code. The decoding subsystem includes a code gate means, an arithmetic decoding means and a decodable control means. The gate means passes any transmitted portion of the data code, except a final one thereof. The arithmetic decoding means decodes respective portions of the data code as they are sequentially inputted thereto through the gate means. The decodable control means decodes the transmitted information code to provide the arithmetic decoding means with information on the total length of the original sequence of the input symbols. The decodable control means further controls the gate means to pass the final portion of the data code so that the arithmetic decoding means, provided with the information, decodes the final portion of the data code to complete generating a set of bi-level symbols to be outputted from the system in the same sequence and with the same total length as the input symbols.

According to the genus of the present invention, when a plurality of bi-level symbols are sequentially inputted to an arithmetic coding-decoding system, a coding subsystem thereof codes the input symbols into a combination of a compressed arithmetic data code and an information code subsequent thereto. The data code consists of a number of portions that may have their data lengths arbitrarily defined but are sequentially transmittable and additionally cooperative with each other to represent an original sequence of the input symbols. The information code is carrying information on a total length that the original sequence of the input symbols has as a total number of symbols, while the information may be given in an arbitrarily adapted form to implement an associated control. For example, it may appear in the form of a total data length of the data code if the data length is defined in correspondence to the total number of the symbols or in a coded form such as a marker to identify a final effective data cooperative with an adaptive arithmetic decoder to ensure that a decoded symbol sequence is identical in total number to the original symbol sequence. The coding subsystem transmits any portion of the data code and is permitted to sequentially transmit respective portions of the data code, which are so coded as the symbols in the original sequence are sequentially inputted, before transmitting the information code which is incomplete before a final symbol is inputted. At a decoding subsystem, the transmitted data code is subjected to a code gate means which may be a register having a certain capacity in terms of data length. The gate means passes any transmitted portion of the data code except a final one that is critical to decoding the data code into a requisite number of bi-level symbols arrayed in a requisite sequence. Respective portions of the data code except the final one pass the gate means in a transmitted sequence and are inputted in that sequence to an arithmetic decoding means, where they are arithmetically decoded into a sequence of bi-level symbols to be outputted from the system in this sequence, which is incomplete before a final subsequence is added. The transmitted information code is received by a control means having a decoding function, i.e. by a decodable control means. The control means decoder the information code by use of the decoding function, and is informed of the information on the total length of the original sequence of the input symbols. It may promptly provide the arithmetic decoding means with the information and promptly thereafter control the gate means to pass the final portion of the data code. Accordingly, with the critical final portion of the data code inputted, the arithmetic decoding means uses this information to decode the final portion thereby to generate the final subsequence of bi-level symbols, when it completes generating a requisite set of bi-level symbols to be sequentially outputted from the system in the game sequence and with the same total length as the input symbols.

According to a species of the genus of the present invention, the coding subsystem comprises an adaptive arithmetic coding means, a symbol counting means and a code transmitting means. The arithmetic coding means is adapted to sequentially code the original sequence of the input symbols into the data code that consists of a sequence of data bits. The data code has the sequentially transmittable portions thereof each composed of a subsequence of the sequence of data bits. The symbol counting means counts the input symbols and codes a total count thereof into the information code. The code transmitting means transmits the data code, and subsequently thereto the information code, so that the coding subsystem outputs the combination of the data code and the information code subsequent thereto.

According to a species of the present invention, the gate means comprises a register means for shifting out any subsequence of the data bits in a transmitted turn thereof and for having a final subsequence of the data bits stored therein awaiting to be inputted to the arithmetic decoding means. The decoding means comprises an adaptive arithmetic decoding means and a symbol output means. The adaptive arithmetic decoding means is adapted to decode the sequence of the data bits input thereto into a relatively long sequence of bi-level symbols to be outputted from the system. This symbol sequence has a starting portion according to the original sequence of the input symbols. The symbol output means sequentially outputs this symbol sequence from the system, while counting the bi-level symbols in the outputting sequence. The control means informs the symbol output means of the total count of the input symbols and controls flushing the register means, so that the symbol output means outputs an according sequence with the original sequence of the input symbols.

According to another species of the genus of the present invention, the coding subsystem comprises an adaptive arithmetic coding means adapted to code the original sequence of the input symbols into the combination of the data code consisting of a sequence of data bits and the information code subsequent thereto. The data code has the transmittable portions thereof each composed of a subsequence of the sequence of data bits, including the final portion composed of a final subsequence of the data bits. The final subsequence has a number of adapted effective bits to be coded to generate a final part of the according sequence with the original sequence of the input symbols thereby to complete the according length with the total length of input symbols. The information code carries information on the effective bits that may be the number of locations in the final subsequence of the data bits.

According to a species of the present invention, the gate means comprises a register means for shifting out any subsequence of the data bits in a transmitted turn thereof and for having the final subsequence of the data bits stored therein waiting to be inputted to the arithmetic decoding means. The decoding means comprises an adaptive arithmetic decoding means adapted to decode the sequence of the data bits inputted thereto into an outputting sequence of bi-level symbols starting with an according sequence with the original sequence of the input symbols. The control means informs the arithmetic coding means of the information on the effective bits, and controls flushing the register means, so that the decoding means can use the information to output the according sequence which is complete with the final part thereof generated.

Another genus of the present invention provides an arithmetic coding-decoding method comprising eight steps. In a first step, the method sequentially codes a set of bi-level symbols, which are inputted in an original sequence with a given total length, into a compressed data code consisting of sequentially transmittable portions that are cooperative with each other to represent the original sequence of the input symbols, while concurrently starting the transmission of respective portions of the data code. In a second step, certain information on the total length of the original sequence is coded into an information code, while the transmission of the data code is completed in that time interval. The information code also is transmitted in a third step. A fourth step arranges transmitted portions of the data code in a transmitted sequence thereof, sequentially shifting them except for a final portion of the data code, sequentially decoding shifted out portions of the data code thereby generating a preceding subsequence of an according sequence of bi-level symbols that is in accord in sequence and length with the original sequence of the input symbols, while outputting the preceding subsequence. At a fifth step, when the final portion of the data code has arrived it is held in a waiting state. Subsequent thereto, the information code arrives and is decoded at a sixth step so as to have the information on the total length of the input symbols. Promptly thereafter, at a seventh step, the final portion of the data code is shifted out. Then, at an eighth step, it is decoded by using the information on the total length of the input symbols, thereby generating a final subsequence of the according sequence cooperative with the preceding subsequence thereof to complement the according sequence.

Another genus of the present invention provides an arithmetic coding-decoding system comprising a symbol count means for counting input bi-level symbols to determine a total count thereof and for generating a symbol count code, a coding means for coding the input bi-level symbols in a compressing manner into a sequence of data codes, a code output means for outputting the symbol count code subsequently to a complete data transmission of the data codes, an analyzing means for analyzing the symbol count code among the transmitted codes from the code output means, a decoding means for decoding the data codes among the transmitted codes, a waiting code register means for holding a final data code subsequence, a symbol output means for outputting a number of decoded bi-level symbols, and a combination of the analyzing means, the decoding means, the waiting code register means and the symbol output means cooperating with each other so that the analyzing means informs, after a complete analysis of the symbol count code, the symbol output means of the number of symbols to be decoded and controls the final data code subsequence to shift it out from the waiting code register means to the decoding means. Bi-level symbols are thereby outputted from the decoding means to symbol output means, and the symbol output means outputs the decoded symbols in accordance with informed data of the symbol count code from the analyzing means.

Another genus of the present invention provides an arithmetic coding-decoding system comprising a coding means for coding input bi-level symbols in a compressing manner to generate a sequence of data codes, a detecting means for detecting a final effective bit data of the data codes, a code output means for outputting a complete output of the data codes and thereafter the final effective bit data, an analyzing means for analyzing the final effective bit data, a decoding means for decoding the data codes, a register means for holding a final data code subsequence, and a combination of the analyzing means, the decoding means and the register means cooperating with each other. After a complete analysis of the final effective bit data, the decoding means is informed of a final effective bit of the data codes, the final data code subsequence is shifted out from the waiting code register means to the decoding means, the data codes are thereby decoded from a decoded sequence portion thereof to the final effective bit, and decoded bi-level symbols are outputted.

According to the present invention, an arithmetic coding subsystem can start transmitting a data code, representative of an original sequence of input bi-level symbols, before having an information code representative of information on a total length of the sequence of the input symbols. This thus permits a prompt transmission of the data code without the need of temporary storage of data code awaiting the information code at the coding side.

BRIEF DESCRIPTION OF THE DRAWINGS

The objects, features and advantages of the present invention will become more apparent from consideration of the following detailed description, taken in conjunction with the accompanying drawings, in which:

FIG. 7 is a block diagram of an arithmetic decoding system cooperating with the coding system of FIG. 3;

DESCRIPTION OF THE PREFERRED EMBODIMENTS

There will be detailed below preferred embodiments of the present invention, with reference to FIGS. 3 to 9.

Figure 1:
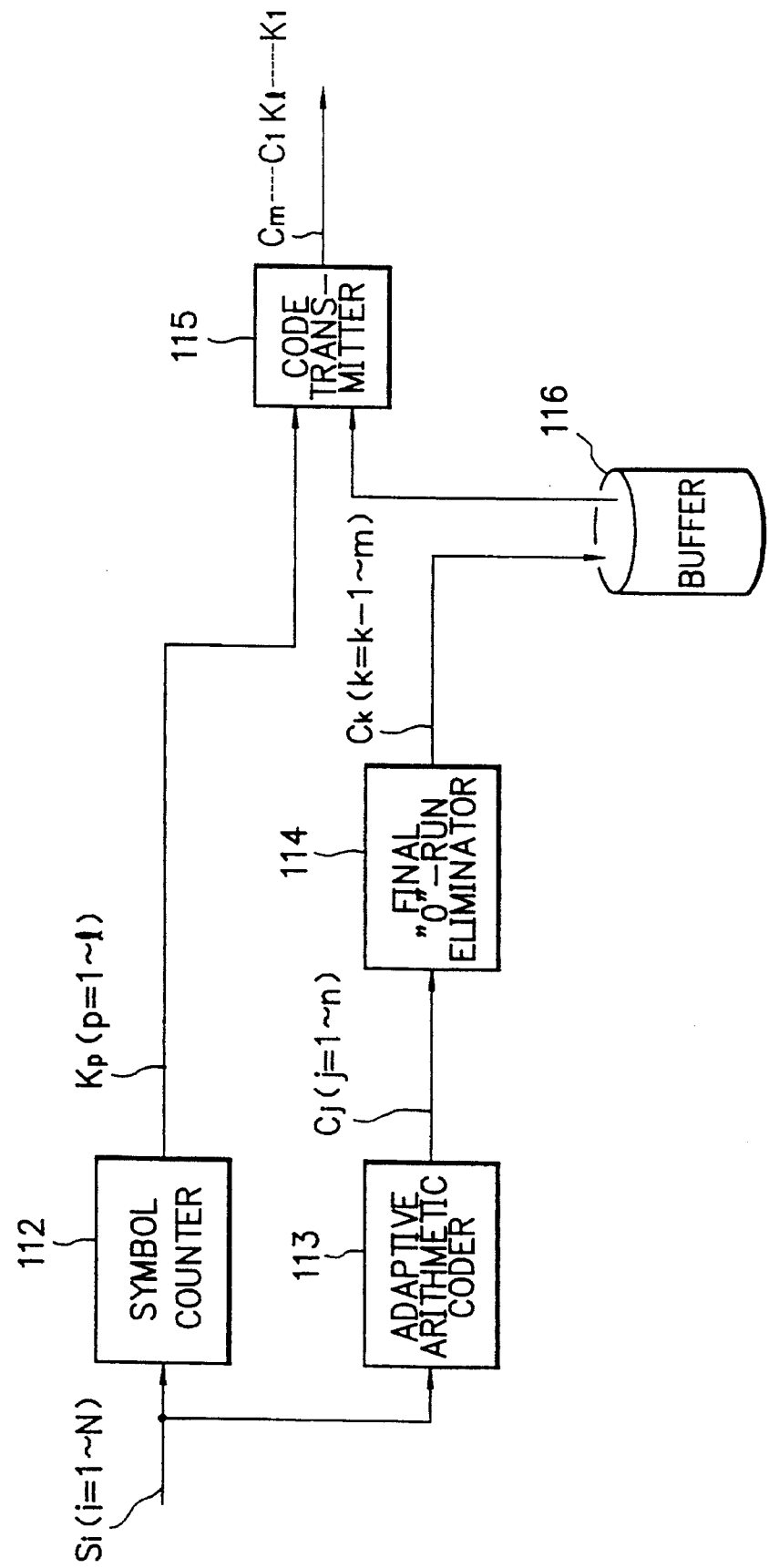
FIG. 1 is a block diagram of a conventional arithmetic coding unit.
Figure 2:
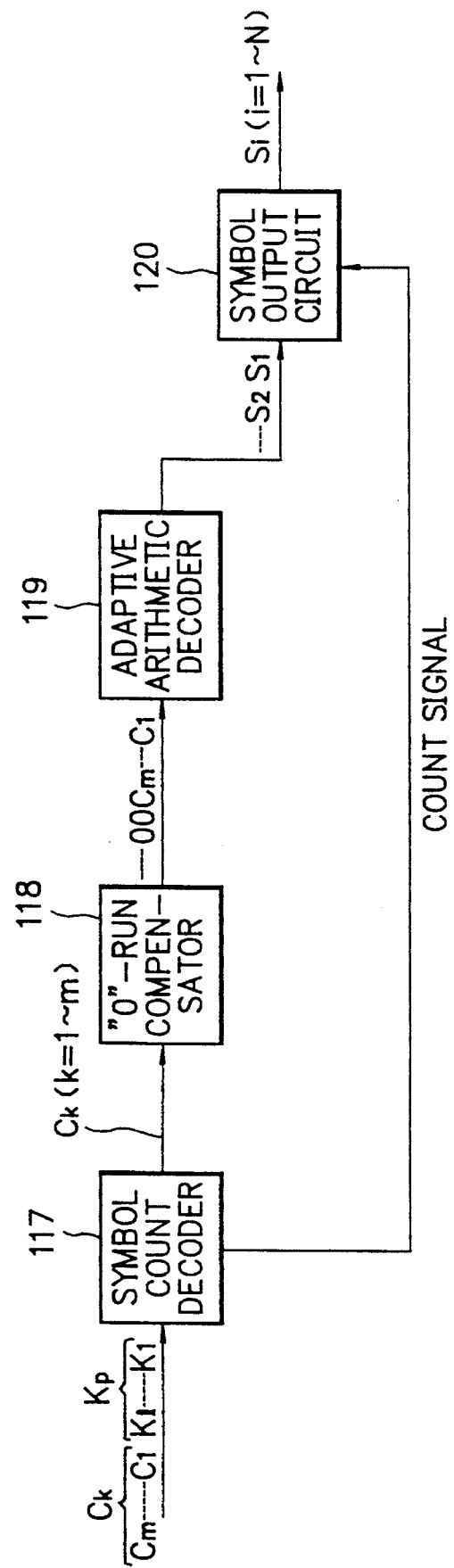
FIG. 2 is a block diagram of a conventional arithmetic decoding unit.
Figure 3:
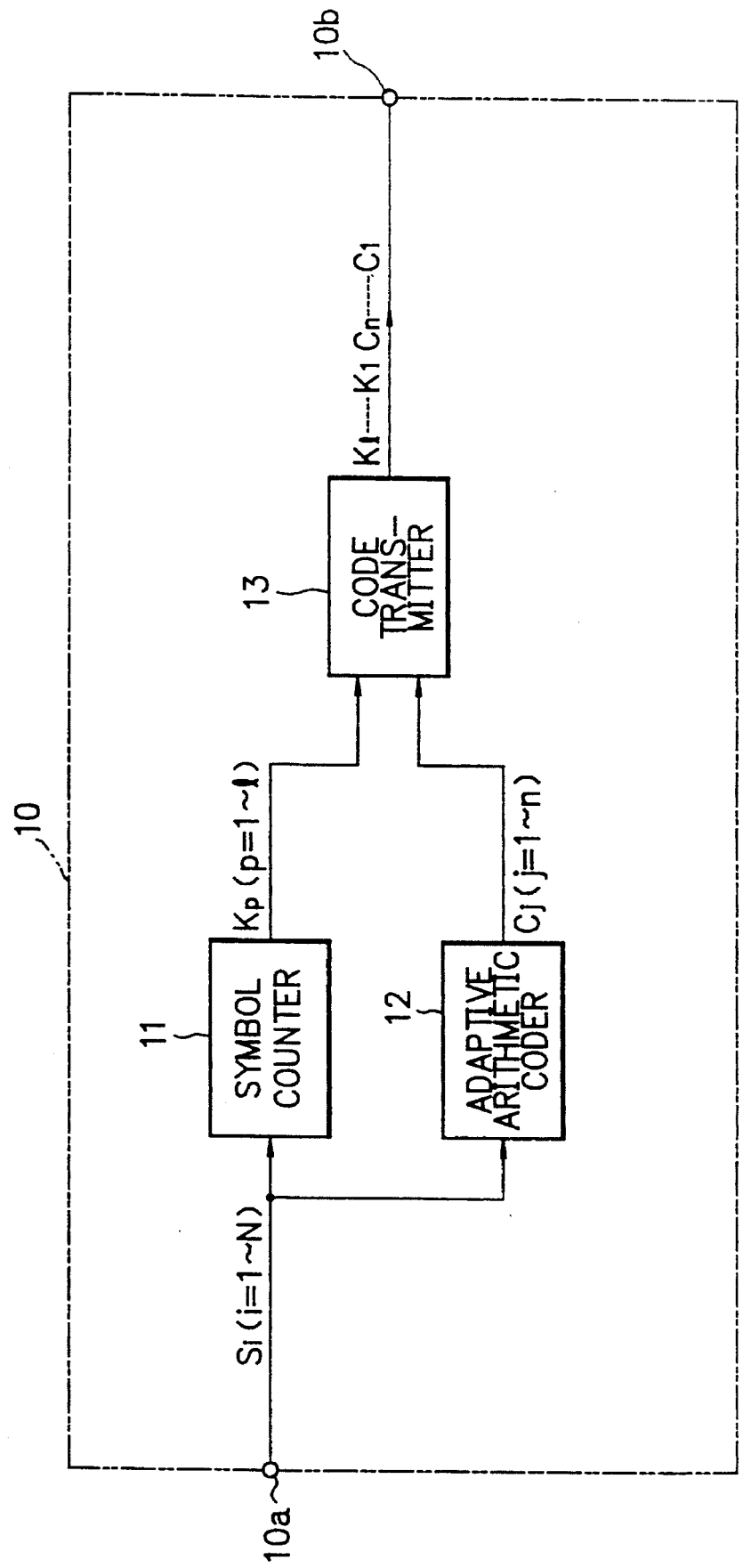
FIG. 3 is a block diagram of an arithmetic coding system according to a first embodiment of the invention.

FIG. 3 shows an arithmetic coding system 10 as a subsystem of an arithmetic coding-decoding system according to a first embodiment of the present invention, in which a data code is transmitted with a symbol count code subsequent thereto. The coding system 10 comprises a symbol counter 11 connected at an input terminal to an input connector 10a or an input interface of the system 10, an adaptive arithmetic coder 12 connected at an input terminal to the connector 10a, and a code transmitter 13 connected at its input terminals to an output terminal of the counter 11 and an output terminal of the coder 12. An output terminal of code transmitter 13 is connecting to an output connector 10b or an output port of the system 10. The coding system 10 may further comprise a conventional trailing "0"-run eliminator (e.g. the eliminator 114 of FIG. 1) interconnected between the output terminal of the coder 12 and a corresponding input terminal of the transmitter 13.

The input connector 10a receives, from an unshown array of pixels in an image scanner of a high-grade facsimile unit, a symbol sequence consisting of a plurality of bi-level symbols Si (i is an arbitrary integer between 1 to N, both inclusive) input in an original sequence, such as an input sequence of high and low voltage levels, that are input to the symbol counter 11, which counts a total number N of the input symbols Si and codes a total count N thereof into a count code in the form of a sequence of bits Kp (p=an arbitrary integer between 1 to l, both inclusive). The symbol sequence is inputted also to the arithmetic coder 12, where the original sequence of the symbols Si is coded into a data code consisting of a compressed datastream in the form of a sequence of bits Cj (j is an arbitrary integer between 1 to n, both inclusive).

The data code in the form of sequential bits Cj is outputted in a byte mode from the arithmetic coder 12 and inputted to the code transmitter 13. To the transmitter 13 is inputted also the count code that is outputted in the form of sequential bits Kp from the symbol counter 11. The transmitter 13 outputs the input bits Cj, one by one in an unchanged sequence, including a start bit $C_1$ and an end bit $C_n$ thereof, before likewise outputting the input bits Kp, including a start bit $K_1$ and an end bit $K_1$. It thus serves as a code traffic controller or a code sequencer for transmitting a code sequence consisting of the data code and the count code subsequent thereto. The code sequence in the form of a datastream has a data length defined by a heading bit as the start bit $C_1$ of the data code and a final bit as the end bit $K_1$ of the count code.

Figure 4:
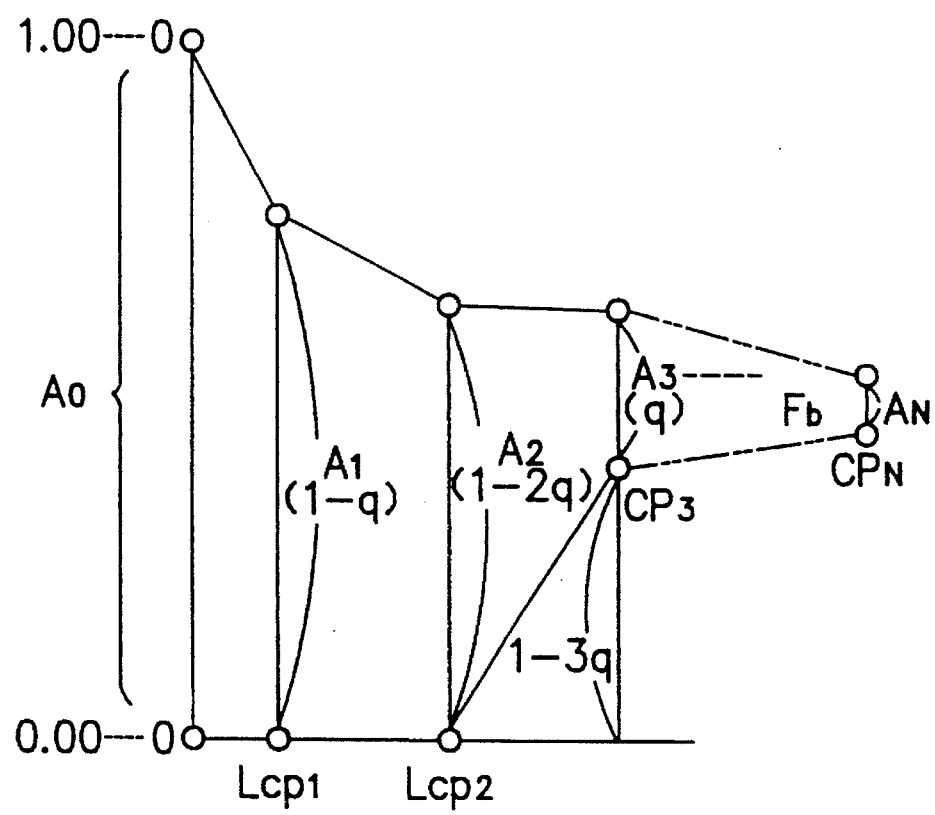
FIG. 4 is a chart describing a principle of an arithmetic coding method applied to the coding system of FIG. 3.

FIG. 4 conceptually shows an entropy coding principle of a subtractive or fixed-augend allocating arithmetic coding method applied to the adaptive arithmetic coder 12 as a conforming QM coder. In a conceptual field of the applied coding method, the original sequence of input bi-level symbols Si to the coder 12 is coded therein by sequentially mapping a probability region of each occurrence of symbol in the sequence unto a vertically extending binary fraction line of a unit length defined between a binary fraction 0.00 ... 0 and a binary fraction 1.00 ... 0, in a known subtractive manner. Any occurrence of symbol Si in the sequence thus has a corresponding mapped interval Ai, called "augend", on the fraction line, and it is defined by a combination of the length (or size) of the augend Ai and a lower bound (or base) CPi thereof.

For example, an occurrence of symbol $s_1$ is defined by an augend $A_1$ with a lower bound $CP_1$; symbol $s_2$, by an augend $A_2$ with a lower bound $CP_2$; $S_3$ by $A_3$ with $CP_3$; ... ; and $S_n$ by $A_n$ with $CP_n$. A null state of symbol occurrence corresponds to an augend $A_o$ of the unit length (0.00 ... 0, 1.00 ... 0) having a lower bound of 0.00 ... 0. Lettnig the probability of occurrence of symbol "0" be p and that of symbol "1" be q and supposing a relationship such that p>>q, "0" is defined as a more probable symbol (MPS), and "1" as a less probable symbol (LPS). As well known, p+q=1. Supposing the symbol $S_1$ be "0", the augend $A_1$ has a length of 1−q on the lower bound $CP_1$ to be 0.00 ... 0. If the symbol $S_2$ also is "0", the augend $A_2$ has a length of 1−2 q on the lower bound $CP_2$ to remain 0.00 ... 0. Then, if $S_3$ is "1", $A_3$ has a length of q on the lower bound $CP_3$ to be 1−3 q, as determined by a subtractive arithmetic operation.

The arithmetic coder 12 is a subtraction type permitting a simplified arithmetic operation in comparison with a multiplication type. In the arithmetic coder 12, the mapping in the conceptual field is implemented by generating a data code consisting of a plurality of sequential bits cj finally representative of a binary fraction in the augend $A_n$ corresponding to the probability of occurrence of a final symbol $S_N$ in the original symbol sequence. For this purpose, the coder 12 is adapted to determine an associated lower bound $CP_N$ in a data shifting manner, and employs it as the corresponding binary fraction.

Figure 5:
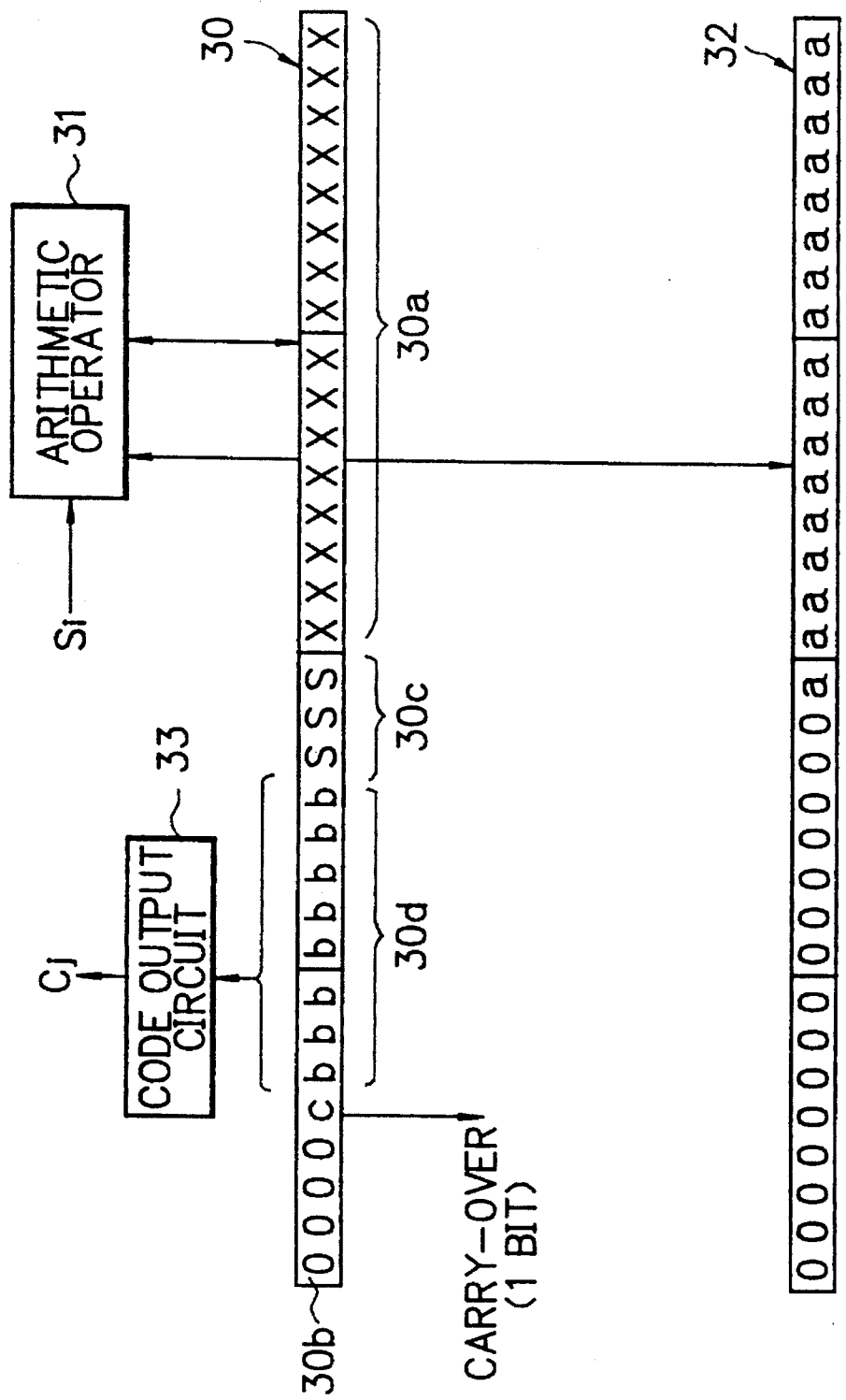
FIG. 5 is a schematic block diagram of an arithmetic coder in the coding system of FIG. 3.
Figure 6:
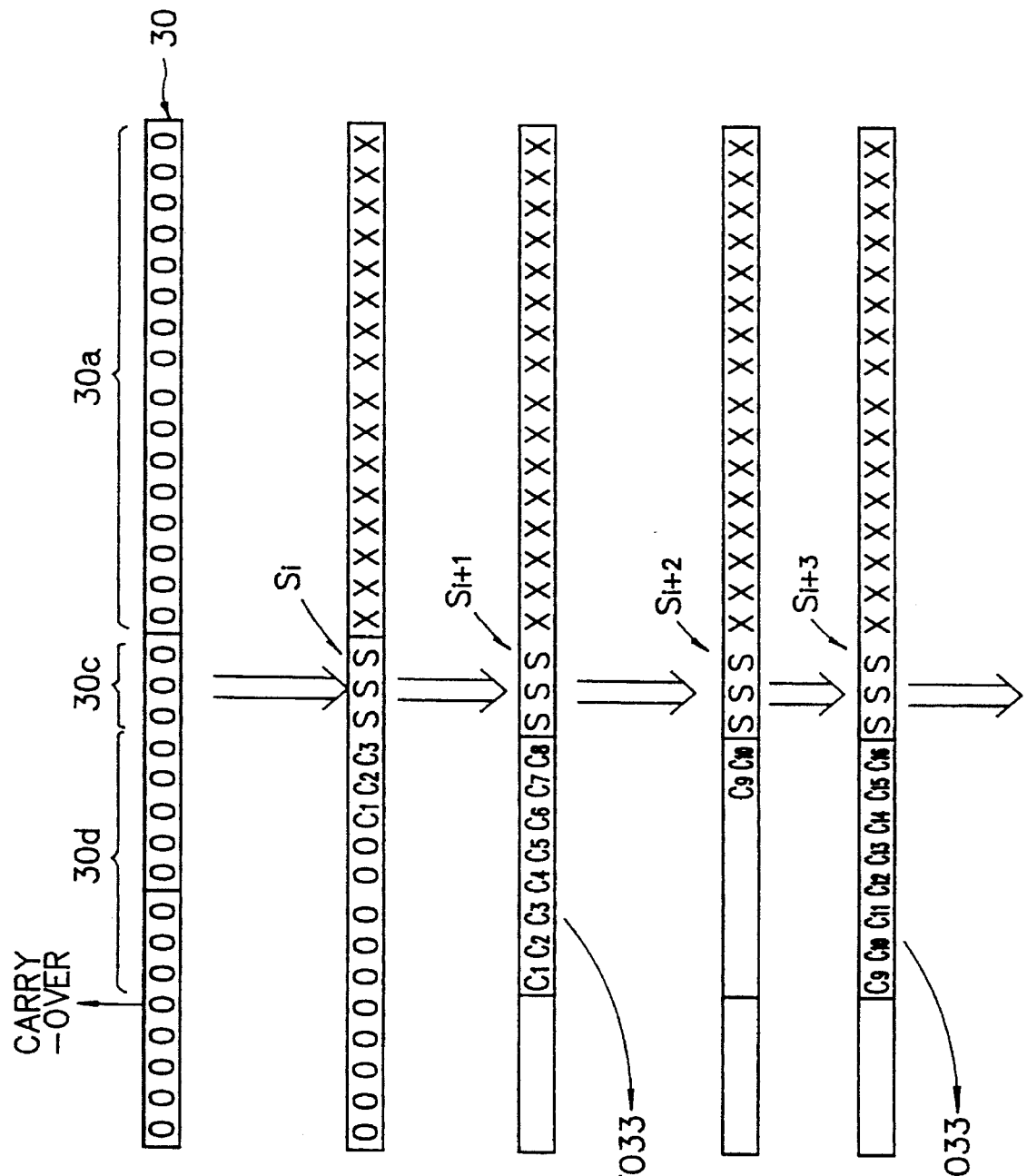
FIG. 6 is a (low chart showing a series of changes in shifted data in a code register of the arithmetic coder of FIG. 5.

FIG. 5 shows a schematic constitution of the subtractive arithmetic coder 12, and FIG. 6 shows a series of changes in shifted data in a code register of the arithmetic coder 12. The coder 12 comprises an arithmetic operator 31 connected to the input terminal of the coder 12, the code register designated at character 30 (hereinafter referred to "C register"), the C register 30 having an operation supporting register section 30a interfaced with the operator 31, an augend register 32 (hereinafter referred to as "A register") interfaced with the operator 31, and a code output circuit 33 interfaced with a data shifting register section 30b of the C register 30 and connected to the output terminal of the coder 12.

The A register 32 supports an arithmetic operation of the operator 31 to determine a current augend Ai; and the C register 30, to determine a current lower bound CPi of augend Ai. The C register 30 as well as the A register 32 is flushed to 0.00 ... 0 in an initial state thereof R1, as shown in FIG. 6. With a plurality of heading symbols Si sequentially input to three bit places of a space section 30c of the C register 30, the operation supporting section 30a with a 16-bit length serves for the operator 31 to arithmetically determine the current lower bound CPi to be set as a data in the form of sequential bits Cr (r is an arbitrary sequential integer) in the data shifting section 30b of the C register 30, as in a typical state shown in FIG. 6.

The current lower bound CPi is a variable dependent on the current augend Ai, and the arithmetic operation of the former is performed in parallel with that for the latter. The C register 30 thus cooperates with A register 32 to serve for the operator 31 to determine the current augend Ai to be set as data in the form of sequential bits in the A register 32. The A register in operation is required to have an equal or larger data value to a critical value of 8000H in hexadecimal notation. With an additional symbol S inputted to the space section 30c, and if the set value is smaller than the critical value, the A register left-shifts the data to thereby have the data value increased over the critical value, under control of the operator 31 which detects the under-critical condition. The left shift of the data in the A register 32 is necessarily accompanied by a corresponding left shift of the set data in the C register 30, under control of the operator 31 which employs a shifted out byte of data from the A register 32 for an operation affecting the left shift in the C register 30. The left shift in the C register 30 causes the data of sequential bits Cr to partially enter an 8-bit output section 30d in the data shifting section 30b of the C register 30, where it is outputted in a byte mode, as in a state R3 shown in FIG. 6, to thereby generate a subset of sequential bits Cj to be outputted through the code output circuit 33. A carry-over of one bit may take place, which can be processed in a well known manner such as a bit stuffing method or a pure output method.

Still additional symbols $S_{i+2}$, $S_{i+3}$ are input to the C register 30 in states R4, R5 shown in FIG. 6, giving the same effects as described, i.e. updating the current augend Ai and the current lower bound CPi, outputting an associated subset of sequential bits Ci in a byte mode.

This operation is repeated until a final symbol $S_N$ in the original symbol sequence is inputted to the C register 30, which updates the current augend Ai and the current lower bound CPi to the augend $A_N$ and the lower bound $CP_N$, respectively, and causes high-order bits of a corresponding data to the augend $A_N$ to be shifted out from the A register 32 and those of a corresponding data to the lower bound $CP_N$ to be outputted from the C register 30, so that low-order bits thereof are left as they are stored in their shifted positions in the registers 32 and 30, respectively.

In the adaptive arithmetic coder 12, the low-order bits left in the c register 30, after an associated arithmetic operation with the final symbol $S_N$, are all flushed out. In this respect, the arithmetic operation By the operator 31 is performed so as to minimize the number of bits Cj in the data code to be outout, by employing in place of the lower bound $CP_N$ an appropriate binary fraction Fb selected from the length of augend $A_N$ in the binary fraction line, such that:

$$CP_N \leq Fb > CP_N + A_N \qquad (2).$$

In other words, a binary fraction Fb having a minimal number of effective digits is selected from between the lower bound $CP_N$ of the augend $A_N$ and an upper bound thereof, with the former inclusive and the latter exclusive. Following the arithmetic operation to determine the binary fraction Fb, the operator 31 controls the C register 30 to flush out the low-order bits left therein, to thereby output the data code consisting of sequential bits $C_n, \ldots, C_2, C_1$ from the data output circuit 33.

FIG. 7 shows an arithmetic decoding system as a subsystem of the arithmetic coding-decoding system according to the first embodiment of the present invention. The decoding system, designated by character 40, comprises a symbol count code decoder 44 connected at a code input terminal to an input connector 40a or an input port of the system 40, a two-byte register 45 connected at a data code input terminal and a control signal input terminal to a code output terminal and a control signal output terminal of the count code decoder 44, respectively, an adaptive arithmetic data code decoder 46 connected at a data bit input terminal to a data bit output terminal of the two-byte register 45, and a symbol transmitter (or a symbol output circuit) 47 connected at a symbol input terminal and a completion signal output terminal to a symbol output terminal and a completion signal input terminal of the data code decoder 46, respectively, and at a count signal input terminal to a count signal output terminal of the count code decoder 44 and at a symbol output terminal to an output connector 40b or an output interface of the system 40.

The input connector 40a receives, from the arithmetic coding system 10, the transmitted code sequence consisting of the data code in the form of sequential bits cj and the count code in the form of sequential bits Kp. The count code is subsequent to the data code so that the bit $C_1$ appears as a heading bit of the input code sequence, and the bit Kl as a final bit. All bits Cj, Kp in the code sequence are sequentially inputted to the count code decoder 44, where each input bit (or byte) is judged as to whether it is a data bit (or a data byte) or not and, if it is so, this bit Cj (or data byte) is outputted to the two-byte register where it is shiftably stored. The register 45 has a capacity for storing a 16-bit (two-byte) length of data, and right-shiftably stores therein first 16 data bits Cj (or two bytes) in their input sequence, such as $C_{16} C_{15} \ldots C_1$ ( or $C_{16}. \ldots C_9, C_{g.} \ldots C_1$). Then, with the next data bit $C_{17}$ (or data byte $C_{24}. \ldots C_{17}$) inputted, the register 45 shifts out the first data bit $C_1$ (or data byte $C_{8}. . . C_1$), outputting it to the data code decoder 46. Each time a subsequent data bit $C_i$ (or data byte $C_{i+8}. \ldots C_i$) is inputted to the register 45, a heading data bit $C_{i-16}$ (or data byte $C_{i-9}. \ldots C_{i-16}$) is outputted therefrom to the decoder 46. With the end data bit $C_n$, (or data byte $C_n. \ldots C_{n-7}$) inputted, the register 45 has the last 16 data bits (or two data bytes) $C_n$ $C_{n-1}. \ldots C_{n-7}, C_{n-5}. \ldots C_{n-15}$ stored therein waiting to be sequentially outputted.

If an input bit (or byte) to the count code decoder 44 is judged to be a count bit (or a count byte), it is processed by the decoder 44 for a decoding analysis to determine the coded total count N of bi-level symbols Si in the original sequence. With all the count bits Kp (or count bytes) processed, the decoder 44 has a completely decoded total count N. The decoded count N is outputted in the form of a count signal CS1 to the symbol transmitter 47, which is thereby informed of a required number N of bi-level symbols Si to be generated in the system 40, and to be transmitted therefrom.

The count code decoder 44 having outputted the count signal CS1 further outputs a control signal CS2 to the two-byte register 45, which is thereby flushed of the waiting 16 data bits Cj (two data bytes) to be outputted to the data code decoder The data code decoder 46 decoder all the input data bite Cj, n in total number, in an adaptive arithmetic manner such that the preceding data bits (or data bytes) $C_{n-16} C_{n-17}. \ldots C_2 C_1$ are sequentially preloaded in a byte mode in an unshown code register of the decoder 46, where they are arithmetically operated to determine a definite series of augend-representative bits. The augend-representative bits are sequentially preloaded in an augend register (not shown) of the decoder 46, where they also are arithmetically operated to determine a definite sequence of corresponding bi-level symbols S $S_{i-1}. \ldots S_2 S_1$ (not reaching the total count N, in number, i.e. i<N, i may be N−2) to be sequentially outputted from the decoder 46 to the symbol transmitter 47.

This is done before the following data bits $C_n C_{n-1} \ldots C_{n-7}$, $C_{n-8} \ldots C_{n-15}$ are similarly processed in a cooperative manner with remaining ones of the preloaded bits in the code register, if any, and in the augend register and in an adapted manner to decode the last byte to determine an indefinite sequence of bi-level symbols $\ldots S_{N+2} S_{N+1} S_N \ldots S_{i+1}$, including a corresponding one to the final symbol $S_N$ in the original sequence, to be sequentially outputted from the decoder 46 to the symbol transmitter 47 which by then has been informed of the total count N.

The transmitter 47 counts every input symbol, outputs the same, until it counts an N-th symbol (to be $S_N$), which is likewise outputted. Upon the counting of $S_N$, the transmitter 47 completes, i.e. stops, symbol transmission and outputs a transmission complete signal CS3 to the data code decoder 46, which is responsive to the complete signal CS3 to stop outputting the indefinite sequence of bi-level symbols. As a result, a corresponding sequence of bi-level symbols to the original one $S_N \ldots S_2 S_1$ is outputted from the decoding system 40.

The register 45 may comprise a register with a capacity to store a sufficient length of data, until the count code CS1 is outputted to the transmitter 47. This permits the adaptive arithmetic decoder 46 to provide a correct N-th or final bi-level symbol to the transmitter 47.

Moreover, the coding system 10 includes a "0"-run eliminator, and the decoding system 40 may have a "0"-run compensator interconnected between the code output terminal of the two-byte register 45 and the code input terminal of the arithmetic decoder 46.

Further, the count code is an information code consisting of sequential bits Kp may be provided in the form of a marker segment comprising: a marker as a combination of an escape byte $K_8 \ldots K_1$ signifying that information to follow has a special marker-coded meaning and a marker byte $K_{16} \ldots K_9$ immediately following the escape byte to define the type of control information being introduced (i.e. of a symbol number control in the decoding system 40); and at least one additional byte $K_1 \ldots K_{17}$ of associated control information, such as for flushing control of the register 45 having the last 16 data bits (or two data bytes) stored therein waiting to be outputted and a timing control to output associated signals including the signals CS1 to CS3.

In that case, the symbol counter 11 in the coding system 10 may be substituted with a coder for coding the original sequence of symbols Si into the marker segment Kp and may be combined with the arithmetic coder 12 to have a common output terminal connected to a simple output circuit. This is because the coder which has to wait the arrival of a final symbol Si before outputting the marker segment may have a delay circuit responsive to flushing of the C register 30 or the flushing-out of a final data byte may be controlled to permit the marker segment to precede subsequently to other preceding data bytes. And the count code decoder 44 in the decoding system 40 may be a marker segment analyzer to serve for the same effects as described.

Figure 8:
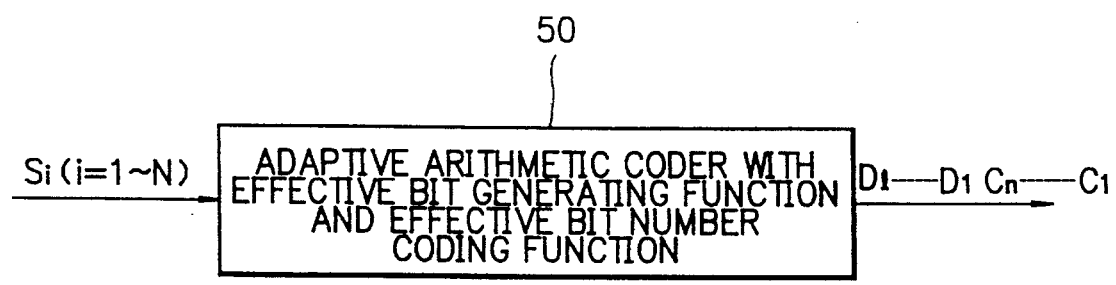
FIG. 8 is a block diagram showing connection of an arithmetic coder in a coding system according to a second embodiment of the invention.
Figure 9:
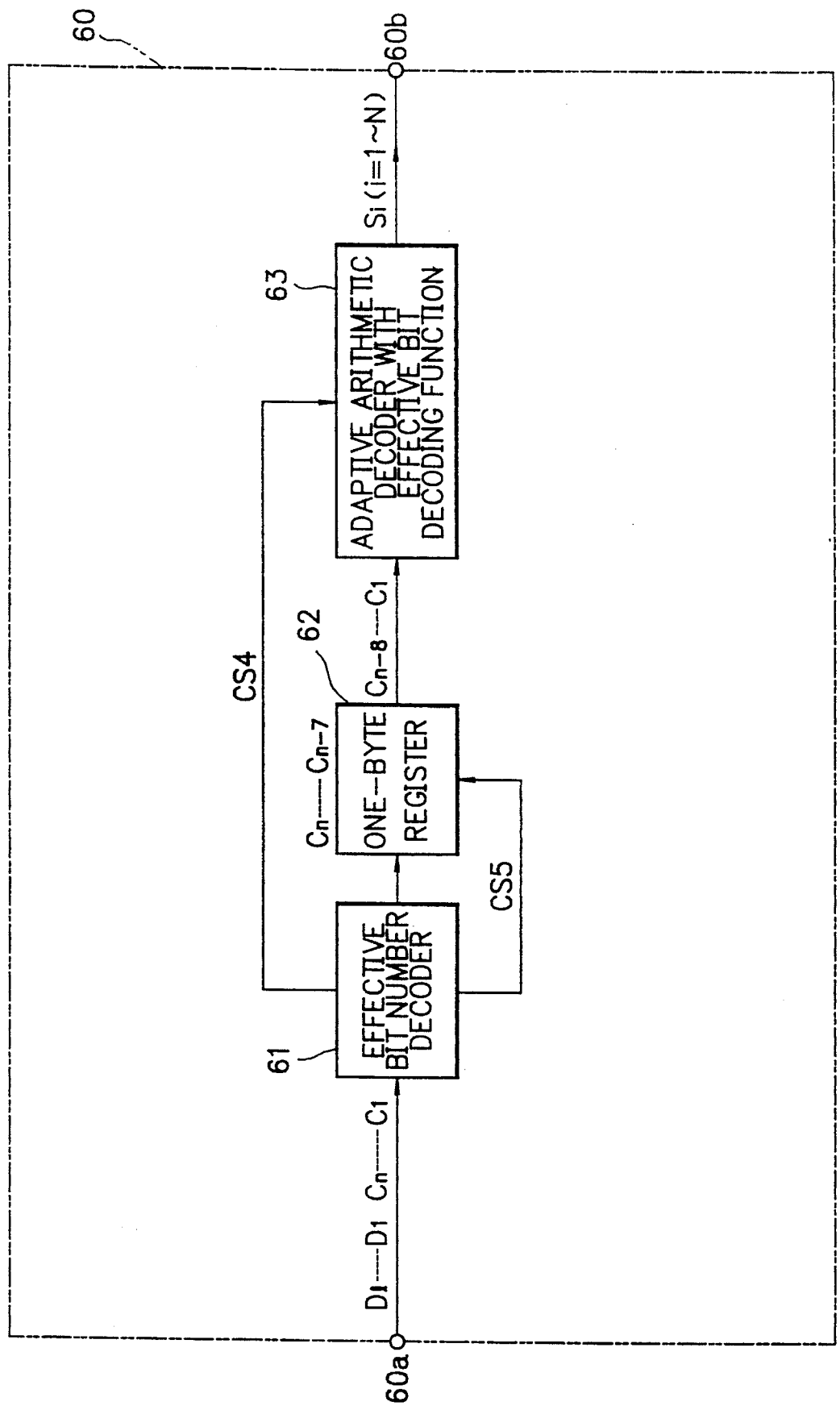
FIG. 9 is a block diagram of an arithmetic decoding system according to the second embodiment of the invention.

FIG. 8 shows an adaptive arithmetic coder in an arithmetic coding system as a subsystem of a coding-decoding system according to a second embodiment of the present invention, and FIG. 9 shows an arithmetic decoding system as a subsystem of the coding-decoding system.

The arithmetic coding system according to the second embodiment is a modification of the coding system 10 according to the first embodiment, and the constitution and associated functions of like members of the former to the latter will not be described for purposes of brevity. Like members, symbols, bits and parameters are designated by like characters. In the coding system according to the second embodiment, the system 10 is modified in that the symbol counter 11 of FIG. 3 is eliminated and the code transmitter 13 of FIG. 3 is substituted by a simple output circuit for transmitting an input code sequence or it may be eliminated, and the adaptive arithmetic coder 12 of FIG. 3 is substituted by an adaptive arithmetic coder 50 shown in FIG. 8, which has an effective bit generating function and an effective bit number coding function, in addition to the adaptive arithmetic coding function described.

As shown in FIG. 8, a plurality of bi-level symbols Si are inputted in an original sequence to the coder 50, where they are conceptually reduced at an A register (32 in FIG. 5) into a series of augends Ai of which lower bounds PNi are converted at a C register (30 in FIG. 5) into a sequence of data bite $C_{n-8} C_{n-7} \ldots C_2 C_1$ to be outputted in a byte mode, like the first embodiment, before an adapted operation by an arithmetic operator (31 in FIG. 5) to flush the C register of a final data byte, i.e., of the last 8 bits $C_n C_{n-1} \ldots C_{n-8}$ consisting of a number e ($1 \leq e \leq 8$) of effective or significant bits and a number f ($=8-e$) of redundant or dummy bits following the effective bits, which are likewise outputted. The effective bits permit an arithmetic decoding to effectively determine the correct last ones of the bi-level symbols Si, in a decoded sequence, to be the same as the original sequence.

In the adapted operation, a lower bound $CP_N$ of a final augend $A_N$ is substituted by an upper bound representative binary fraction Fa in the augend $A_N$, such that:

$$Fa = CP_N + A_N p(LSB) \qquad \ldots (3)$$

where, p(LSB) is a probability of occurrence of LSB being equal to 0.0 ... 01 with a necessary number of digits to define the fraction Fa in binary notation. The defined fraction Fa thus represents an upper bound of the final augend $A_N$ which conceptually is a number line open at the upper end.

With the final data byte flushed out, associated data bits $C_n \ldots C_1$ are all outputted in a complete form as a data code to be transmitted from the coding system. Immediately thereafter, by use of information on the fraction Fa put under control of an arithmetic operator, the coder 50 outputs an effective bit number code as marked information or an instruction code consisting of a sequence of bits Dp (p is an arbitrary integer between 1 to 1, both inclusive) representative of the number e of effective bits in the final data byte, so that the data code cj the information code A code sequence consisting of the data code Cj and the information code Dp is thus transmitted from the coding system to the decoding system, designated by numeral 60 in FIG. 9.

The decoding system 60 comprises an effective bit number decoder 61 connected at a code input terminal to an input connector 60a or a input port of the system 60, a one-byte register 62 connected at a data code input terminal and a control signal input terminal to a data code output terminal and a control signal output terminal of the effective bit number decoder 61, respectively, and an adaptive arithmetic decoder 63 having an effective bit decoding function. The arithmetic decoder 63 is connected at a data bit input terminal to a data bit output terminal of the register 62, and at a control signal input terminal to a control signal output terminal of the effective bit number decoder 61, and at a symbol output terminal to an output connector 60b or an output interface of the system 60.

The input connector 60a receives the transmitted code sequence. Data bits Cj and information bits Dp in the code sequence are sequentially inputted to the effective bit number decoder 61, where each input bit (or byte) is judged as to whether or it is a data bit Cj (or a data byte). If it is a data bit Cj, the bit Cj (or byte) is outputted to the one-byte register 62. The register 62 first stores therein first eight bits Cj (or one byte) in their input sequence such that $C_8 C_7 \ldots C_1$. Then, each time a subsequent bit $C_i$ (or byte $C_{i+7} \ldots C_i$) is inputted to the register 62, a heading one $C_{i-9}$ of stored eight bits $C_{i-1} C_{i-2} \ldots C_{i-9}$ (or a preceding byte $C_{i-1} \ldots C_{i-9}$ having been stored therein till then) is outputted therefrom to the arithmetic decoder 63. With an end bit $C_n$ (or byte $C_n \ldots C_{n-7}$) inputted, the register 62 has the last eight bits $C_n C_{n-1} \ldots C_{n-7}$ (or the end byte stored therein waiting to be outputted.

If an input bit (or byte) to the effective bit number decoder 61 is an information bit Dp (or an information byte), it is processed by the decoder 61 for a decoding analysis to determine the number e of effective bits Cj in the final byte of data code. With all the information bits Dp (or information bytes) processed, the decoder 61 has a completely decoded effective bit number e. which is outputted as an information signal CS4 to the adaptive arithmetic decoder 63, which is thereby informed of the number e.

The effective bit number decoder 61 then outputs a control signal CS5 to the one-byte register 62, which is thereby flushed of the waiting eight bits Cj (or the last data byte) to be output to the arithmetic decoder 63.

The arithmetic decoder 63 decodes all the input data bits Cj, n in total number, such that the preceding data bits $C_{n-8} C_{n-9} \ldots C_1 C_2$ are sequentially preloaded in a byte mode in a code register, where they are arithmetically operated to determine a series of augend-representative bits, which are sequentially preloaded in an augend register. At the augend register they are arithmetically operated to determine a sequence of bi-level symbols $S_i S_{j-1} \ldots S_2 S_1$ (not reaching the total count N, in number, i.e. i<N, 1 may be N−1) to be sequentially outputted from the decoder 63, which has been informed of the effective bit number e, before the following data bits $C_n C_{n-1} \ldots C_{n-7}$ are preloaded and the first e bits $C_{n-7+6} \ldots C_{n-7}$ (e.g. $C_{n-5} C_{n-6} C_{n-7}$ if e=3) thereof (to be effective bits) are similarly processed in a cooperative manner with remaining ones of the preloaded bits in the code register, if any, and in the augend register and in an adapted manner to decode the effective bits to determine the last bi-level symbol(S) $S_N$ ( $\ldots S_{i+1}$) to be outputted from the decoder 63. As a result, a corresponding sequence of bi-level symbols Si to the original sequence are outputted from the decoding system 60.

It will be seen that the information code Dp in the second embodiment may also comprise a marker segment, as in the first embodiment.

Moreover, in each embodiment, the arithmetic coder 12 or 50 and the arithmetic decoder 46 or 63 are both of a subtraction type and may be alike in their respective structures. The coders 12 and 50, as well as the decoders 46 and 63, may also be alike in structure, subject to the protocols of their adaptive arithmetic operators. In other words, in each embodiment, the coder and decoder are different from each other in that the data processing direction is reversed, and their structures and functions are covered by FIGS. 4 to 6 and the associated description.

Further, it also will be seen that the object of coding and decoding is an original sequence of logical values of bi-level symbols, but not the bi-level symbols themselves.

According to the present invention, at a symbol coding side, a data code consisting of sequential data bytes that carries data of an original sequence of symbols Si is transmitted before an information code that carries control information for controlling at least a last or final one of the data bytes at a symbol decoding side, thereby permitting a prompt transmission of the data code.

Still more, as an example in varieties of applicable decoding methods, at least the last data byte is kept waiting until the information code is decoded, which permits proceding data bytes to be promptly decoded. Then, the last data byte is processed to be decoded according to the control information, assuring that the original sequence of bi-level symbols is reproduced without errors.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An arithmetic coding-decoding system comprising:
   a coding subsystem for coding a set of bi-level symbols inputted to the system, in an original sequence with a given total length, into a combination of a compressed arithmetic data code and an information code subsequent thereto, the data code having sequentially transmittable portions cooperative with each other to represent the original sequence of the input symbols, the information code carrying information on the total length of the original sequence, and the coding subsystem for transmitting any portion of the data code and the information code; and
   a decoding subsystem including:
      a code gate means passing any transmitted portion of the data code except a final one;
      an arithmetic decoding means decoding respective portions of the data code, as they are sequentially input thereto through the code gate means; and
      a decodable control means decoding the transmitted information code to provide the arithmetic decoding means with the information on the total length of the original sequence of the input symbols and controlling the code gate means to pass the final portion of the data code so that the arithmetic decoding means provided with the information decodes the final portion of the data code to thereby complete generating a set of bi-level symbols to be outputted from the system in the same sequence and with the same length as the input symbols;
   the code gate means includes a register means shifting any subsequence of the data bits in a transmitted turn thereof to input to the arithmetic decoding means, and the register means having a final subsequence of the data bits stored therein waiting to be inputted to the arithmetic decoding means;
   the arithmetic decoding means includes:
      an adaptive arithmetic decoding means decoding the sequence of the data bits inputted thereto into a long sequence of bi-level symbols starting with an according sequence with the original sequence of the input symbols; and
      a symbol output means sequentially outputting from the system while counting the bi-level symbols in the long sequence;
   the decodable control means informs the symbol output means of the total count of the input symbols and controls to flush the register means so that the symbol output means outputs the according sequence of the bi-level symbols out of the long sequence;

the adaptive arithmetic decoding means includes a reduction type adaptive arithmetic decoder; and the final subsequence of the data bits represents an intermediate binary fraction between a lower bound and an upper bound of a final augend corresponding to a final symbol in the original sequence of the input symbols.

2. An arithmetic coding-decoding system comprising:

a coding subsystem for coding a set of bi-level symbols inputted to the system, in an original sequence with a given total length, into a combination of a compressed arithmetic data code and an information code subsequent thereto, the data code having sequentially transmittable portions cooperative with each other to represent the original sequence of the input symbols, the information code carrying information on the total length of the original sequence, and the coding subsystem for transmitting any portion of the data code and the information code; and a decoding subsystem including:

a code gate means passing any transmitted portion of the data code except a final one;

an arithmetic decoding means decoding respective portions of the data code, as they are sequentially input thereto through the code gate means; and a decodable control means decoding the transmitted information code to provide the arithmetic decoding means with the information on the total length of the original sequence of the input symbols and controlling the code gate means to pass the final portion of the data code so that the arithmetic decoding means provided with the information decodes the final portion of the data code to thereby complete generating a set of bilevel symbols to be outputted from the system in the same sequence and with the same length as the input symbols;

the code gate means includes a register means shifting any subsequence of the data bits in a transmitted turn thereof to input to the arithmetic decoding means, and the register means having the final subsequence of the data bits stored therein waiting to be inputted to the arithmetic decoding means;

the arithmetic decoding means includes an adaptive arithmetic decoding means decoding the sequence of the data bits inputted thereto into an according sequence with the original sequence of the input symbols;

the decodable control means informs the adaptive arithmetic decoding means of the information on the bits and controls to flush the register means so that the decoding means outputs the according sequence complete with the final part thereof;

the adaptive arithmetic decoding means includes a reduction type adaptive arithmetic decoder; and the bits in the final sequence of the data bits cooperatively represent a binary fraction on an upper bound of a final augend corresponding to a final symbol in the original sequence of the input symbols.

* * * * *